US007058562B2

(12) United States Patent
Powell

(10) Patent No.: US 7,058,562 B2
(45) Date of Patent: Jun. 6, 2006

(54) APPARATUS AND METHOD FOR PERFORMING EVENT PROCESSING IN A MIXED-LANGUAGE SIMULATOR

(75) Inventor: Edward W. Powell, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 892 days.

(21) Appl. No.: 09/798,485

(22) Filed: Mar. 3, 2001

(65) Prior Publication Data
US 2002/0166110 A1  Nov. 7, 2002

(51) Int. Cl.
G06F 17/50 (2006.01)
G06F 9/45 (2006.01)
(52) U.S. Cl. .............................. 703/22; 703/16; 703/17
(58) Field of Classification Search .................. 703/22, 703/16, 17
See application file for complete search history.

(56) References Cited

U.S. PATENT DOCUMENTS 5,905,883 A * 5/1999 Kasuya ......................... 703/17
6,152,612 A * 11/2000 Liao et al. ..................... 703/23
6,427,223 B1 * 7/2002 Kim et al. ...................... 716/4
6,457,152 B1 * 9/2002 Paley et al. .................. 714/738

OTHER PUBLICATIONS

David A. Burgoon, "A Mixed-Language Simulator for COncurrent Engineering" Proceedings for the 1998 IVC/VIUF Conference, pp. 114-119.*
Thomas J. Schriber and Daniel T. Brunner, "Inside Simulation Software: How it works and Why it Matters", Proceedings of the 1994 Winter Simulation Conference, pp. 45-54.*
Meyer S. "Verilog plus C language modeling with PLI 2.0: The next generation simulation language", Verlog HDL Conference and VHDL International Users Forum, 1998. IVC/VIUF, pp. 98-105.*
Burgoon, et al, entitled, "A Mixed C/Verilog Dual-Platform Simulator," Proceedings in the 9th Annual International HDL Conference and Exhibition, Mar. 2000.
David Burgoon, entitled, "Achieving Concurrent Engineering for Complex Subsystem Design: The Case for Hardware Functional Modeling using C," Hewlett-Packard Company, On-Chip System Design Conference, 1998.
Burgoon, et al, entitled, "Next Generation Concurrent Engineering for Complex Dual-Platform Subsystem Design," Hewlett-Packard Development Company, System-on-Chip Desing Conference, 2000.
Bjarne Stroustrup, "The C ++ Programming Language," Addison-Wesley, Reading, MA, (3rd ed. 1997).
Sternheim, et al., "Digital Design and Synthesis with Verilog HDL," Automata Publishing Company, San Jose, CA, (1993).

* cited by examiner

Primary Examiner—Paul L. Rodriguez
Assistant Examiner—Dwin M. Craig

(57) ABSTRACT

An apparatus performs event processing in a mixed-language simulator. The apparatus comprises logic for generating a list of actions to be performed for a given trigger event occurrence and for processing at least some of the listed actions in a source-code-to-HDL-interface domain before performing a context switch from the source-code-to-HDL-interface domain to a source code model domain. By listing actions to be performed for a given trigger event occurrence and then processing listed actions before switching contexts, the amount of context switching between the HDL model domain and the source code model domain that occurs during the simulation is reduced.

31 Claims, 8 Drawing Sheets

APPARATUS AND METHOD FOR PERFORMING EVENT PROCESSING IN A MIXED-LANGUAGE SIMULATOR

TECHNICAL FIELD OF THE INVENTION

The present invention relates to a mixed-language simulator and, more particularly, to a method and an apparatus for performing event processing in a mixed-language simulator that utilizes models written in different languages to simulate hardware designs.

BACKGROUND OF THE INVENTION

It is known to mix models of hardware blocks written in the C programming language with models of hardware blocks written in the Verilog® hardware description language (HDL). These models are input to a Verilog® (hereinafter referred to as "Verilog") simulator program, which performs the hardware simulation. One advantage of using the C programming language to construct some of the modeling blocks, rather than modeling all of the blocks in the Verilog HDL, is that it allows a higher level of abstraction to be used to create the major components of the hardware product being designed. For example, high-level C language descriptions can be written for ICs (Integrated Circuits) and modules within the ICs. These models can then be tied together early in the development cycle to form a complete system-level model. Full system level simulations can then be performed throughout the development of the product, thereby minimizing the potential for discovering system-level defects during the final integration of hardware and software.

Once the higher-level system model has been generated, each hardware block comprising the system model is then progressively refined to lower levels of abstraction by writing the lower-level model portions in the Verilog HDL until the lowest levels of the models, i.e., the gate or transistor levels, have been generated. The mixed-language capability of the simulator allows uneven, parallel development among teams designing different pieces of the project, and provides the flexibility needed to optimize full-system simulation for performance and memory usage.

One of the problems associated with existing implementations of Mixed C and Verilog simulators is the overhead involved with switching context between the Verilog and C portions of the simulation. Prior techniques have included running the C simulation as a separate process with a communication channel to the HDL simulator, or, alternatively, running the C model code and the HDL simulator in the same process, but executing the C model code directly and immediately on trigger signals when events occur in the simulator. With both techniques, a large number of context switches are required. Context switches increase processing overhead, which results in penalties in terms of simulator performance.

SUMMARY OF THE INVENTION

The present invention provides an apparatus and a method for performing event processing in a mixed-language simulator in a manner that minimizes context switching between at least one model written in a source code language and at least one model written in a hardware description language (HDL). The present invention comprises logic for generating a list of actions to be performed for a given trigger event occurrence and for attempting to process at least some of the listed actions in a source-code-to-HDL-interface domain before performing a context switch from the source-code-to-HDL-interface domain to a source code model domain.

The HDL model domain corresponds to execution of a model written in the HDL. The source code model domain corresponds to execution of a model written in the source code language. The source-code-to-HDL-interface domain corresponds to execution of source-code-to-HDL-interface code. By generating the list of actions and attempting to perform at least some of the actions before the context switch is performed, an amount of context switching between the HDL model domain and the source code and interface domains performed during simulation is minimized.

The method for performing event processing in a mixed-language simulator, which may be performed by a computer program being executed by the apparatus of the present invention, comprises the steps of determining when a trigger event has occurred, if a determination is made that a trigger event has occurred, determining a type of trigger event that has occurred, generating a list of actions to be performed based on the determination made as to the type of trigger event that has occurred, determining which of the actions in the list are enabled and which of the actions in the list are not enabled, attempting to process each of the enabled actions, and causing a context switch from a source-code-to-HDL-interface domain to a source code model domain to occur once attempts have been made to process each of the enabled actions. When the context switch from the source-code-to-HDL-interface domain to the source code domain occurs, the source code language model is executed.

These and other features and advantages of the present invention will become apparent from the following description, drawings and claims.

DETAILED DESCRIPTION OF THE INVENTION

Figure 1:
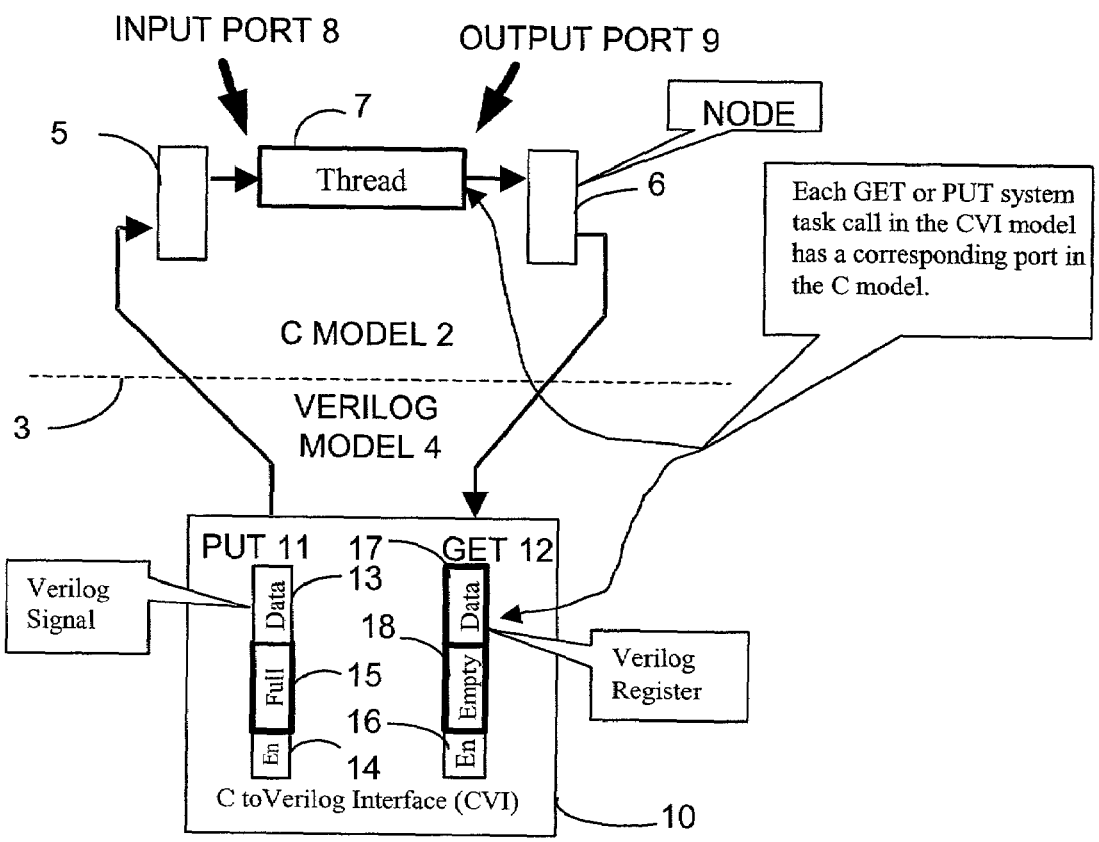
FIG. 1 is a block diagram illustrating the manner in which mixed-language model portions are set up and the manner in which they interact with one another in accordance with one embodiment of the present invention.

In order to minimize context switching overhead, the present invention collects all of the evaluations of the C model that occur at a given simulation time and places them in a single invocation of C model evaluator, thus minimizing the number of memory transitions required between the C simulator and the HDL simulator. By doing this the computer system on which the simulation is executing can take better advantage of local caching of memory, and thus the execution speed of the mixed simulation is enhanced.

The present invention provides for specifying the configuration of models prior to a mixed-language simulation and for performing an event processing algorithm during the simulation to simulate a hardware design. The term "mixed-language," as that term is used herein, is intended to denote the mixture of models written in some higher-level source code programming language and models written in a hardware description language (HDL). The present invention is not limited to using any particular higher-level source code programming language or to any particular HDL. However, because Verilog hardware simulators are currently the most widely used simulators, the present invention will be described with respect to using a Verilog simulator and the associated Verilog HDL and Verilog programming language interface (PLI).

Similarly, because the C programming language is currently the most popular source code programming language utilized with Verilog simulators to create mixed-language simulators, the present invention will be described with respect to using this particular programming language with a Verilog simulator and the associated Verilog HDL and PLI.

However, the description of the present invention is only being limited in this way for purposes of brevity and for the purpose of illustrating one particular embodiment of the present invention. Those skilled in the art will understand, in view of the description provided herein, the manner in which other source code programming languages and other simulators, HDLs and PLIs may be utilized to carry out the present invention.

The following references, which are incorporated herein by reference in their entireties, provide information relating to hardware simulation, including mixed-language hardware simulation, and it is believed that they may be useful reference materials for understanding the concepts and implementation details of the present invention: Burgoon, David A., Powell, Edward W., Sorensen, Lief J., Waitz, John A. Sundragon, "Next Generation Concurrent Engineering for Complex Dual-Platform Subsystem Design," Proceedings of the DesignCon 2000 On-Chip System Design Conference; Burgoon, David A., "Achieving Concurrent Engineering for Complex Subsystem Design: The Case for Hardware Functional Modeling using C," Proceedings of the DesignCon 1998 On-Chip System Design Conference, pp. 357–371; Burgoon, David A., "A Mixed-Language Simulator for Concurrent Engineering," Proceedings for the 1998 IVC/VIUF Conference, pp 114–119; Sternheim, Eli Ph.D. interHDL, Inc.; Rajvir Singh, interHDL, Inc.; Yatin Trivedi Y T Associates "Digital Design and Synthesis with Verilog HDL" ISBN 0-9627488-2-x, Copyright 1993 Automata Publishing Company, San Jose, Calif. 95129; and Stroustrup, Bjarne, "C++ Programming Language, Third Edition" ISBN 0-201-88954-4, copyright 1997 by AT&T.

An embodiment of the present invention will now be described with reference to utilization of a Verilog simulator, its associated HDL and PLI, and the C programming language to describe the manner in which the configurations of the models are specified prior to simulation and the manner in which event processing occurs during simulation. Specifying the configurations of the models to be used during simulation is accomplished in accordance with the present invention in a manner that is easy, efficient, and non-redundant. Processing of events during simulation is performed in a manner that maximizes simulator performance. Rather than using separate processes for performing event processing for models written in the C programming language and models written in the Verilog HDL, a single process algorithm is utilized. All of the models are comprised as threads within the same process and the event processing algorithm minimizes switching between the HDL simulator thread and the C model threads.

Because the tasks associated with specifying the configurations of the models are performed prior to simulation, the manner in which these tasks are performed will first be described with reference to FIGS. 1–4, and then the manner in which events are processed during simulation in accordance with the present invention will be described with reference to FIGS. 5–8. The present invention improves hardware modeling by (1) simplifying the task of writing C models, (2) simplifying the writing of a C-to-Verilog Interface (hereinafter referred to as "CVI") and (3) improving the performance of the resulting mixed C/Verilog simulation. Objective (1) is accomplished by providing a new C language application programming interface (API) that makes the C code look more like Verilog code modules. Objective (2) is accomplished by employing a set of Verilog PLI tasks that understand how the C API functions. Objective (3) is accomplished by compiling the C model into the Verilog executable so that the all events are processed in the same process.

The version of the PLI utilized in accordance with an example embodiment is Verilog PLI Version 2.0, although other PLI versions, such as Verilog PLI Version 1.0, for example. The Open Verilog International (OVI) PLI functions of both PLI versions have been adopted as part of the Verilog Procedural Interface (VPI) specified in the IEEE 1364 standard. The VPI functions corresponding to PLI Version 2.0 provide a consistent, object-oriented model for accessing all Verilog data structures.

The basic concepts of the present invention will now be described with reference to the block diagram of FIG. 1, which illustrates the manner in which models written in C are interfaced with models written in Verilog. The elements of the portion 2 of a C model to be simulated are above the dashed line 3. The elements of the portion 4 of a Verilog model to be simulated are below the dashed line 3. The C model portion 2 comprises input and output nodes 5 and 6, respectively, thread(s) 7, input port 8 of the thread(s) 7 and output port 9 of the thread(s) 7. The C-to-Verilog Interface (CVI) module 10, which interfaces the C model portion 2 with the Verilog portion 4, is written in Verilog.

The CVI module 10 utilizes PUT and GET calls 11 and 12, respectively, and Verilog signals and registers. The Verilog signals of the PUT calls are the "data" signal 13, and the "enable" signal 14. The PUT calls utilize a "full" register 15. The Verilog signal of the GET calls 12 is the "enable" signal 16. The registers of the GET calls 12 are the "data" and "empty" registers, 17 and 18, respectively. The signals of the PUT and GET calls 11 and 12 are objects that are declared as type Wire in the Verilog HDL. The registers of the PUT and GET calls 11 and 12 are declared as type Reg in the Verilog HDL.

The signals 13, 14, and 16 can be viewed as input ports on the CVI module 10 that do not have internal registers declared for them. The values of the signals are fed in to either the PUT or GET calls from outside of the CVI module 10, or are stored locally within the CVI module 10 and fed to the PUT and GET calls. The aforementioned VPI functions that enable the C code to manipulate Verilog objects from within the CVI module 10 preferably only write values into objects that are of type Reg, but can sample the values of both type Reg and type Wire.

When a trigger event occurs, the PUT call 11 samples the data signal 13, which is the data argument to the PUT call 11, and stores the value that is sampled into the node 5 to which it corresponds. The nodes 5 and 6 preferably have a first-in-first-out (FIFO) structure, as discussed below in more detail. If node 5 becomes full, the PUT call will write a value to the register 15 associated with the PUT call 11 to indicate that the node 5 is full and cannot accept more data. If the enable signal 14 is low, then preferably the PUT action is disabled. In this case, when a trigger event occurs that triggers the PUT call 11, the PUT call 11 will not attempt to sample data or send data out to the node 5 when an event occurs that triggers the PUT call 11. If the enable signal 14 is high when an event occurs that triggers the PUT call 11, preferably the PUT call 11 will be enabled and data will be sampled and output to the node 5.

With respect to the GET call 12, if the enable signal 16 is high when an event occurs that triggers the GET call 12, preferably the GET call will read data out of the node 6, which corresponds to the data argument of the GET call 12, and write the data to data register 17 specified by the data argument of the GET call 12. If the node 6 is empty, preferably the GET call 12 will set a value in the register 18 to indicate that the node 6 was empty. If the enable signal 16 is low when an event occurs that triggers the GET call 12, preferably the GET call 12 will be disabled and will not attempt to read data out of the node 6. The enable signal 16 could be disabled (i.e., low) when, for example, a downstream CVI or Verilog block (not shown) is not ready to receive more data. Both the PUT and GET calls 11 and 12, respectively, receive clock signals that trigger them when a specified signal transition edge (i.e., a trigger event) of the clock occurs.

The CVI module 10 system tasks execute as part of the combined C and Verilog simulation process. In accordance with the present invention, the C model portion 2 represents the functionality of a Verilog module by having one or more "threads" 7. A thread 7 can be thought of as a separate stream of execution that shares memory with other threads in the same process. This allows all of the threads to communicate through a first-in-first-out (FIFO) structure of the nodes 5 and 6. The order of execution of threads 7 can be controlled to execute in a selected order mode, or allowed to run in a random order mode. Utilizing the controlled order mode ensures that simulation results will be repeatable.

Each of the threads 7 has a list of input ports 8 and output ports 9 through which they read and/or write a specific associated node. The thread 7 can write to a node through an output port 9 and read from a node through an input port 8. A port is preferably connected to exactly one node, but a node may connect with multiple thread input/output ports. Thread module "instances" are wired together by associating their ports to nodes. Code modules can also be instantiated into higher-level code modules to form a hierarchy. The nodes associated with the ports of each thread or module instance are unique. For example, if a block containing a node is instantiated more than once in the design, then each block instance contains a distinct copy of that node.

Conceptually, a node represents a collection of wires in a hardware design that conveys information between blocks. As stated above, the node preferably is modeled as a FIFO. The FIFO has a size that preferably is specified at design initialization. The node holds a list of data values that are to be passed between blocks sequentially. Each entry in the node is stored with the same type of C language "struct," which is a user-defined type that can have an arbitrary size. The data in the FIFO can be thought of as the values that would appear on the wires of a design over time. The depth of the node controls how many future data values the C model can calculate before the FIFO full state of the node 6 causes it to suspend. The concept of storing data representing the value of a signal at multiple times will be referred to herein as "temporal buffering".

A node maintains a list of the threads that read or write to it. Writing to the node preferably corresponds to adding data to the next empty slot in the list. Each reader of the node has a separate read pointer associated with it. A data slot in the FIFO is not considered empty until all readers have read that slot. For an input/output (I/O) port on a C model, the thread that is writing does a read after every write. This is because the I/O port is also listed as a reader of the node. Therefore, if the writing thread did not read back the values, the thread's read pointer would get behind and permanently stall. A thread also reads all data from other threads coming in on an I/O port of a C model before starting to write to the I/O port of the C model. This ensures that the internal state of the thread will be consistent with all past events before the change in write/read direction occurs.

Since different compilers encode data in C structures in different orders, each node has function pointers associated with it that can be used to encode and decode the C structures in a standard byte order. Preferably, only nodes attached to ports associated with CVI modules need to define and set encode and decode function pointers. Nodes connected to C model ports associated with CVI modules utilize additional information added to the node when GET and PUT tasks are processed during the simulation initialization. The CVI implementation of the present invention uses separate calls for reading and writing nodes that pass in information about which CVI instance is performing the read or write operation. The CVI read and write operations preferably exchange data only with the set of threads associated with the CVI instance.

There preferably are four CVI system tasks that are utilized by the present invention, namely, $gps_get_fm_c( ), $gps_put_to_c( ), $gps_pull_fmco( ), $gps_push_to_c( ). These system tasks are only used in the Verilog initial block of a CVI module 10. Each call to a system task preferably is associated with exactly one port on the C model. The port handle argument along with the Verilog instance path of the calling CVI module is used to uniquely identify the corresponding C port instance. A given C model port has only one input type CVI function and one output type CVI function associated with it.

The C model API of the present invention includes C model tools that form a new C model API having a corresponding set of API rules. A C model API library preferably is built around two basic concepts, namely, modules and nodes. The C model API modules are used to mimic the hierarchical nature of a hardware design and are intended to map one-to-one to the top-level modules in the corresponding Verilog model portions of the design. The syntax for a C model API module preferably looks similar to that of Verilog and preferably Verilog module templates are created from C by running a translator that exports the C model hierarchy in the form of a Verilog netlist. There are two types of C model API modules, namely, blocks and threads. Blocks only call other blocks and/or threads, and thus have no behavioral code associated with them. They are essentially like a Verilog module containing only instantiations of other modules. A thread is a leaf module that models behavior and only calls C model API library functions and standard C functions.

A C model API module preferably has only one argument, namely, a pointer to a user-defined structure. The user-defined structure preferably includes a list of three predefined types, namely, gps_input, gps_output, and gps_inout, which are described below with reference to an example of a C model API of the present invention, and constants, which preferably are of type "int." All data comes into or leaves a C model API module through the ports defined in the argument. Thus, a typical (thread) C model API module declaration in accordance with the present invention might look as follows:

```
gps_struct(mfu)      // the struct name (mfu) must match a module name
{
    gps_input    reset;
    gps_output   busy;
    gps_input    fifo_in;
    gps_output   fifo_out;
    gps_inout    readback_bus;
    int          mfu_reg;   // local mfu register
};
gps_module_thread(mfu, myptr)   // (modulename,reference_pointer_to_struct)
{
    // assume there are 3 mfu's in this design so they each need a
    // separate set of registers
    int data;  // this is a procedure local so it disappears each
               // pass thru the thread
    gps_read_or_suspend(myptr->fifo_in,&data)
    if (something)
        myptr->mfu_rag = data;
    else
        gps_write_or_suspend(myptr->fifo_out,&data);
}
```

The nodes of the C model API of the present invention greatly simplify the creation of the CVI modules. All communication between C model API modules is accomplished through nodes. Thus, a port of one C model API module is connected to a node, which is then connected to one or more ports of other C model API modules. A node is equivalent to a bus or wire in Verilog. In C, a node essentially allows time to be separated between modules that mimic parallel execution, but that, in reality, execute one at a time (i.e., on a uniprocessor, or in repeatable simulation mode). A node does not communicate with another node, but rather, it communicates with a thread module containing reads or writes on one of the module ports. Thus, preferably only one node is allowed on any one "net," or set of connections to modules. It is up to the designer to determine where in the hierarchy the node is actually declared. Nodes are most easily created in a calling block, but can be created inside a called block, as discussed below in more detail. The following example below demonstrates this.

Specifically, a node may be created by declaring its name and then calling gps_inst_node( ) with its depth and width. To ensure good performance, it has been determined that a depth declared to be 64 or greater is suitable, and that only power of 2 depths should be allowed. By programming a node to a depth of 1, tight coupling between threads can be obtained. This is useful for signals such as, for example, "reset" (which typically has multiple readers), where it is undesirable for threads to proceed until all threads have been reset.

As stated above, nodes preferably can have multiple readers and multiple writers. If there are multiple readers, each reader advances at its own rate. The slowest reader determines the "used" count (the number of occupied node entries) for all writers. With multiple writers, it is up to the programmer to control which thread may write to a node next, in order to keep the write data in the proper order. Writes can be forced to occur, even if the node is full, by using the argument gps_write_over( ), as opposed to what is referred to herein as the gps_write_or suspend( ) argument. In accordance with the preferred embodiment, the ability to read without the possibility of suspending is provided by checking the node "used" count (i.e., using gps_used( ) or gps_empty( )) before issuing the read (i.e., before using the gps_read_or suspend( )).

A port on a module may be declared gps_inout. When this is the case, it is preferable that the programmer or designer ensure a node is always read to an empty condition before writing the node. In addition, every write should be accompanied by a "dummy" read to insure that the read pointer for the writing thread does not get behind. Nodes preferably have data-in-flight between threads. When modeling signals such as "busy" or "WPNE" (write pipe not empty) that indicate unprocessed data, the receiving block cannot indicate a busy condition because it has not read the data yet. To solve this problem, the node write functions preferably allow a secondary node to be written, as a side effect of writing the primary node. This is accomplished by attaching one or more "busy" nodes to an instantiated node. Whenever the node is written, a "1" will also be written to the attached "busy" nodes, which can only have a data width of "int." "Busy" nodes preferably will generally have a depth of 1 and are written in overwrite mode since only the latest value is important. "Reset" nodes also preferably have a depth of 1 to insure that all blocks have read the reset value before a new value can be written.

Locks (i.e., gps_node_lock_or_suspend( ) and gps_unlock( )) are used to prevent another thread from changing the state of a node that needs to be frozen. This is necessary on "busy" nodes where one thread is attempting to clear the "busy" signal, while another thread is trying to set the "busy" signal as a side effect of writing an input to the first thread. Thus, locks allow a thread to safely change an output by blocking other threads from performing operations that may affect the output. One or more "reset" nodes may also be attached to a node. When an attached "reset" is "1," the node will reset all internal pointers to zero. Attached "reset" nodes may only have a width of "int." The C model API of the present invention creates a special thread that goes through all the attached "reset" nodes looking for an active reset data value. When it finds one, it forces each node into a reset state until the reset condition is cleared.

Below is an example of the manner in which nodes can be created and hooked up or connected to modules. It should be noted that the identifier "chip" corresponds to a block module and "mfu" corresponds to a thread module.

```
gps_struct (chip)
    {
    gps_input    reset;
    gps_input    in_bus;
    gps_output   out_bus;
    };
gps_module_block (chip, chipports)
    {
        gps_decl_node(mfu0to1);       // declare node
        gps_decl_node(in_bus);        // input node is declared inside chip !
        gps_decl_node(busy0);         // busy for mfu0
        gps_node_busy1;               // busy for mful -
                                      // another way to do the same thing
        gps_decl_inst(mfu,mfu_0);     // declare one instance of mfu
        gps_decl_inst(mfu,mfu_1);     // declare another instance of mfu
        unsigned int   bus;           // bus is 32 bits
        // end of declarations - start executable code
        gps_inst_node(busy0,1,sizeof(int));   // create busy node
        gps_inst_node(busy1,1,sizeof(int));   // create busy node
        gps_inst_node(chipports->in_bus,64, sizeof (bus));
        // create input node
            gps_node_busy(mfu0to1,busy0);    // attach busy to node
        gps_inst_node(mfu0to1,64,sizeof(bus));    // create node depth=64
            gps_node_rset(mfu0to1,port->reset);    // attach reset to node
            gps_node_busy(mfu0to1,busy1)           // attach busy to node
        // instantiate and wire up mfu_0
        gps_inst_module(mfu_0);
            gps_port(mfu_0->reset      ,chipports->reset)
            gps_port(mfu_0->fifoin     ,chipports->in_bus);
            gps_port(mfu_0->fifoout    ,mfu0to1);
            gps_port(mfu_0->busy       ,busy0);
            gps_cnst(mfu_0->mfu_id     ,0);
            gps_end();
        // instantiate and wire up mfu_1
        gps_inst_module(mfu_1);
            gps_port(mfu_1->reset      ,chipports->reset)
            gps_port(mfu_1->fifoin     ,mfu0to1);
            gps_port(mfu_1->fifoout    ,chipports->out_bus);
            gps_port(mfu_1->busy       ,busy1);
            gps_cnst(mfu_1->mfu_id     ,1);
            gps_end();
    }
```

It should also be noted that the node for in_bus on chip preferably is declared inside the module instead of at the next higher level in the hierarchy. This allows programmers or designers who prefer to embed the node into a block to do so since it is modeling a FIFO present in that block. Because no node exists in the higher level, when chip is instantiated, the port name is used twice in the gps_port hookup call as shown below:

gps_inst_module(chip_instance);

gps_port(chip_instance->in_bus,   chip_instance->in_bus);

Preferably, all C model API exposed defines, variables, typedefs, structures, and function calls are contained in the file gps_hwsim.h. Most functions preferably are macros that invoke one or more functions.

| Preferred Embodiment of the C Model API |
|---|
| The C model API, in accordance with the preferred embodiment, is described by the following: |

| | |
|---|---|
| declaration macros: | |
| gps_struct(ModuleName) | used to declare a module structure |
| gps_module_block(ModuleName) modules | used to declare block (hierarchy) |
| gps_module_thread(ModuleName) | used to declare thread (leaf) modules |
| gps decl inst(ModuleName,InstanceName) | used to declare an instance of a module |
| gps_decl_node(NodeName) | used to declare a node |
| typedefs: | |
| gps_node | alternate way to declare nodes |
| gps_input | used to declare an input port in the gps_struct |
| gps_output | used to declare an output port in the gps_struct |
| gps_inout | used to declare an bi-directional port in the gps_struct |

Preferred Embodiment of the C Model API

The C model API, in accordance with the preferred embodiment, is described by the following:

module instantiation macros:

| | |
|---|---|
| gps_inst_module(InstanceName) | instantiate a module |
| gps_port(PortName,Nodename) | hook up module port |
| gps_cnst(PortName,Value) | hook up module constant port |
| gps_end() | end instantiate | node instantiation macros:

| | |
|---|---|
| gps_inst_node(NodeName,Depth,Width) | instantiate a node |
| gps_node_rset(NodeName,ResetNodeOrPort) | attach a reset to node |
| gps_node_busy(NodeName,BusyNodeOrPort) | attach a busy to node | node macros:

| | |
|---|---|
| gps_free(PortName) | returns int (free == 0) means full |
| gps_used(PortName) | returns int (used == 0) means empty |
| gps_empty(PortName) | returns TRUE/FALSE |
| gps_full(PortName) | returns TRUE/FALSE |
| gps_write_or_suspend(PortName,&Data) | normal write |
| gps_write_over(PortName,&Data) | trash last empty if full |
| gps_read_or_suspend(PortName,&Data) | normal read |
| gps_peek_or_suspend(PortName,&Data) | get data but don't advance node |
| gps_io_read_or_suspend(PortName,&Data) | for input/output nodes |
| gps_read_if_not_empty(PortName,&Data) | reads one entry if not empty |
| gps_read_until_empty(PortName,&Data) | read until empty (no suspend) | miscellaneous functions:

| | |
|---|---|
| gps_suspend() | suspend the current thread (nothing else to do) |
| gps_node_lock_or_suspend(PortName) | lock thread ports (used for busy determination) |
| gps_unlock() | unlock all locked thread ports |
| gps_force_thread_active() completed | the thread is considered active even if no ops |

The manner in which a mixed-language simulator is initialized in accordance with the preferred embodiment of the present invention will now be described. One of the primary features of the present invention that enables non-redundant specification of the configuration of the mixed-language model is that, inside the initial blocks of the Verilog model, tasks are called that analyze the hierarchy path within the Verilog model and identify the corresponding hierarchy path in the C model. These tasks mark flags within the C model that inform the C model of which connections within the C model are to be enabled or disabled. The specific way in which these functions are accomplished in accordance with the preferred embodiment will now be described with reference to the flow chart of FIG. 2.

The first step in specifying the configuration is to dynamically load the project-specific portion of the C model into the simulator, as indicated by block 21 in the flow chart. When the C model is loaded, C code contained within a shared library is loaded into the executable image of the simulation process by the operating system dynamic loader. This is accomplished through use of a VPI callback triggered at the beginning of the Verilog initialization sequence, or, in the case of a stand-alone C model, on startup of the stand-alone C model simulation. The phrase "stand-alone C simulation" is intended to denote herein simulation of a hardware design in which the code models utilized by the simulator to perform the simulation are all written in the C programming language (i.e., no models are written in an HDL).

The shared library comprises functions defined in the C language that will be used by the simulator during simulation. An argument is defined to specify the shared library name for the C model to be loaded. Function naming rules are defined to help avoid namespace collisions of C model functions with simulator functions.

Once the C model has been loaded, a C model builder function is called to build the C model hierarchy, as indicated by block 22. During the initialization phase of startup, the C model threads and nodes are instantiated in order to build the C model hierarchy. The C model may have run-time configurable options that control how the C model is built. In this case, these options can be specified through command line arguments that allow the user to specify name=value pairs in a namespace specific to the C model. If a variable name is not found in the C model namespace, then the Verilog variable definition namespace will be searched. In the case of a stand-alone C simulator, a "Verilog Namespace" will be created in the stand-alone C simulator by placing values set with Verilog style command line arguments into the Verilog namespace.

A scope resolution syntax preferably is provided to allow the C model author to restrict the resolution of a variable to only the C or Verilog namespace. The syntax of the variable definition arguments for the stand-alone C simulator is kept the same as that used for the Verilog simulator. The stand-alone C simulator will also provide a mechanism, similar to the Verilog "-f" argument, for reading arguments from a file. This simplifies writing of the "makefile" used to invoke the simulator. The same code for accessing the C model namespace can be used in the stand-alone C simulator and in the Verilog simulator. The configuration of the design is specified in a file that is interpreted in conjunction with the makefile to produce a list of invocation arguments for the simulator, including C model variable definitions, Verilog defines, include directories, and specific files to be loaded or compiled. It should be noted that variables defined in the Verilog namespace can be used to control selection of hierarchy options in both the C and Verilog portions of the model.

After the C model has been built, the Verilog "initialization" (initial) blocks are executed, as indicated by block 23 in the flow chart. Inside of these blocks, calls are made to the GET and PUT tasks. Each GET and PUT call knows where it was called from in the Verilog model hierarchy. These calls use their respective hierarchy paths in the Verilog model to find the corresponding hierarchy paths in the C model. When these calls find the ports of the corresponding paths in the C model, they cause the respective ports in the C model to be tagged to indicate that the ports have corresponding GET and PUT calls in the Verilog CVI module. From this tagging process, the C model can determine which ports are active in the C model and which are not. Ports in the C model that are inactive correspond to portions of the C model that are to be simulated with the Verilog model. Ports in the C model that are active correspond to portions of the mixed-language model that will be simulated with the C model portions and the resulting signals will be processed and interfaced to the Verilog model portions by the CVI modules 10.

A "Port_CVI_mode" and "Node_CVI_mode" flag exist for each of the ports and nodes of the C model. In the case of a stand-alone C model simulator, when the C model is invoked in stand-alone mode, all of the Port_CVI_mode flags are initialized to "false," and all of the C model threads are therefore active. When a mixed C and Verilog simulation is started, all of the port CVI mode flags are initialized to "true". When the CVI GET and PUT tasks are called from the initial blocks of the CVI modules, the flag on the corresponding port, and any hierarchical ports at higher levels, will be set to "false". The C model then uses the flag settings to determine which connections are to be left active. A C model with all CVI_mode flags on its ports set to "true" is deactivated because the functionality of that model portion is to be simulated in Verilog. A C model with all of the Port_CVI_mode flags set to "false" is assumed to be active, either because a CVI module is present or because the stand-alone C simulation was started. If some of the Port_CVI_mode flags are set to "true" and some are set to "false" on a primitive CVI instance, an error is reported indicating that the CVI module has not handled all the ports of the corresponding C model.

At the end of the Verilog initialization sequence, a C model invocation phase occurs, as indicated by block 24. During this phase, a routine is called to determine which C models are active and, if so, which of its ports that correspond to CVI module ports are active. This is needed to optimize simulation performance by eliminating node connections and VPI callback events that are not needed. The routine determines whether C model ports that are associated with CVI ports are active by checking the readers and writers of each node in the C model. Any node that has reader or writer ports with the Port_CVI_mode flag set to "true" gets flagged as Node_CVI_mode "true." CVI module ports connected to nodes in the C model that have their Node_CVI_mode flags set to "true" are enabled by the routine. Enablement of a CVI mode node can be thought of as allowing the values of data modeled in C nodes to be read from or written to the corresponding Verilog signals. For special case situations, a node can be forced to be active by preceding the port name with 'F:' in the CVI system task first argument. This preferably is used only when it is desired to force a node's data to be copied to Verilog, even if the node connects only between two CVI modules.

The aforementioned $gps_get_fm_c( ),$gps_put_to_c( ), and $gps_push_to_c( ) CVI system tasks are also responsible for setting up callbacks that are activated when a user-specified Verilog event occurs, such as a clock edge or value change. For a given trigger event, a list of callback actions to be performed is created in the CVI module. The order in which the actions are performed is determined by the order in which the calls appear in the CVI module. For each call, a list of previously defined callback events is searched, and, if found, a callback action is added to the list for that event. If a callback event is not found on the list, a new callback action list is created. Each callback action includes information about the corresponding C model port and the Verilog signals associated with it.

The CVI modules 10 preferably ensure that the data in the Verilog registers is formatted consistently, independent of machine architecture and compiler. To accomplish this, CVI code performs checks to determine if a node has an associated "encode/decode" function pointer that is set. If it does, then this function is used to reorder the bytes returned from or written to the C model into a standard, machine-independent order. A default "encode/decode" function that handles integer data preferably is provided in the thread library. For other data types, the author of the C model preferably set a model-specific "encode/decode" function for all nodes that may connect to CVI modules of the Verilog model.

Figure 2:
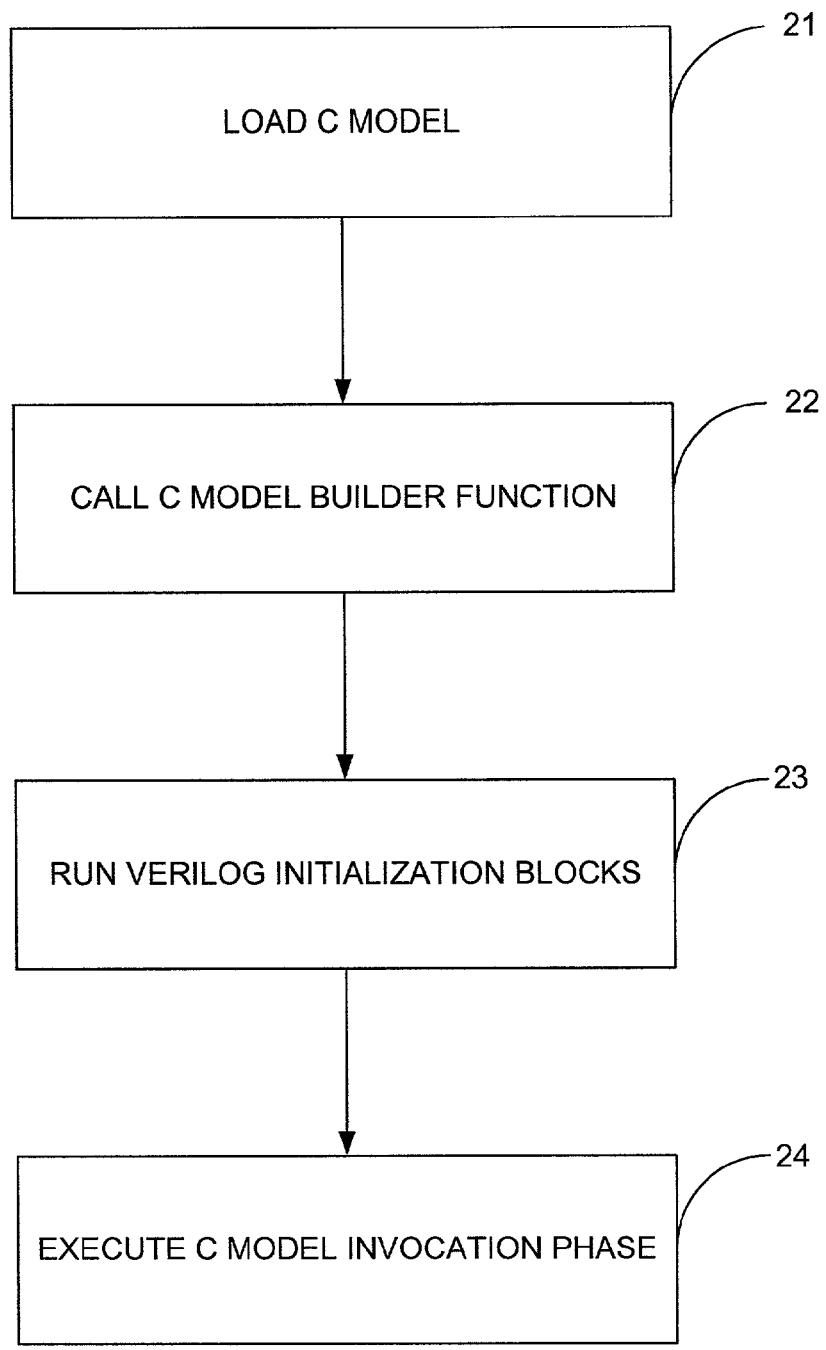
FIG. 2 is a flow chart illustrating the manner in which the present invention for automatically specifying the configuration of a mixed-language model such that it is specified without redundancy.

It can therefore be seen from the discussion of FIG. 2 that the CVI modules 10 are responsible for "self-configuring" the connections between threads when invoking in a mixed C and Verilog simulation. Thus, duplication, or redundancy, is avoided when specifying if models are to use Verilog or C. The CVI modules 10 corresponding to any blocks that are to be modeled in C are simply loaded into the Verilog simulator, and the CVI modules 10 then automatically activate the appropriate connections. Therefore, no C model language specific arguments are needed to control model mode.

The read and write operations on nodes that are in CVI mode differ from those of nodes that are in C-only mode. An example node structure for a CVI mode node is shown below in Table 1.

TABLE 1

| CVI mode node structure | | | | | | | | | | | | | |
|---|---|---|---|---|---|---|---|---|---|---|---|---|---|
| C2V subnode | Src ID | Dest ID | Data | WP | RP T1 | RP T2 | RP T3 | RP T4 | RP T5 | RP C1 | RP C2 | RP Lag | |
| V2C subnode C1 | Data | WP | RP T1 | RP T2 | RP Lag | | | | | | | | |
| V2C subnode C2 | Data | WP | RP T3 | RP T4 | RP T5 | RP Lag | | | | | | | |

When a node is in CVI_mode, its depth is reduced to 2 if it was greater than 2. The SrcID and DestID values shown in the table are used to insure that data is addressed so that the CVI routines communicate only with their corresponding threads. The DestID value is also used to inform the CVI module that a write of NULL data occurred. A NULL data write by the C model results in the status register being set low, and the Verilog signal being set to high-Z. The source and destination checking makes it possible for the CVI modules of the Verilog model to support bi-directional connections, with multiple readers and writers. A bi-directional example is discussed below with reference to FIG. 4.

An optional status register value can also be used as the tri-state control signal in the CVI modules of the Verilog model. Blank boxes in Table 1 represent data storage locations. When a node is converted to CVI mode, it has a V2C (Verilog-to-C) subnode created for each CVI writer of the node. Each CVI instance that reads the node is registered in a C2V (C-to-Verilog) subnode read pointer list. In the C2V and V2C sections of the node, a lagging read pointer indicates the oldest unread data slot. Each thread that reads the node is registered in the C2V subnode, and in the V2C subnode for the CVI instance to which the thread corresponds.

CVI read or write operations pass in an inst ID value as an argument. The inst ID value is used to find the correct read pointer in the C2V subnode for a read, and the correct V2C subnode to which to write. The CVI read calls always read from the C2V portion of the node. The CVI write calls always write to the V2C portion of the node. The V2C subnode always has a depth of 1. The V2C data value holds the last data sampled from Verilog. A read pointer for each C model corresponding to a CVI instance is allocated in the V2C subnode. This read pointer indicates whether the corresponding C model has read the data in the V2C subnode.

When a C model portion writes a CVI mode node, it sets the C2V write pointer (WP). When a C model thread reads a CVI mode node, it advances its corresponding read pointer (RP) in the V2C subnode. If the C2V read pointer indicates unread data for that thread, then the C2V read pointer is also advanced. The C2V pointer may be empty in the case where the data in the V2C subnode came from a Verilog model driving the net associated with this node.

As stated above, the Verilog signal arguments may be wire or register type Verilog objects. Any arbitrary set of signals can be combined by declaring a wire object with an assign expression containing a concatenation of signals. The resulting list of bits in CVI Data_sig or Data_reg arguments to the GET and PUT tasks must correctly map to the fixed byte order defined by the encode/decode function of the C model port's associated node. It is up to the CVI module author to correctly map the generic signals associated with the GET and PUT tasks to the specific signals and protocol of the Verilog model portion that is being modeled. A CVI module may use as many GET and PUT calls as needed. All of the callback actions are grouped by trigger event, and the actions for a given trigger event are executed in the order in which the system tasks appear in the CVI module's initial block. Actions that are blocked at a given trigger event may prevent other actions for the same trigger event in the CVI module from completing. The CVI system tasks are as follows:

$gps_put_to_c(Port_handle, En_sig, Timing_control, Full-_reg, Data $gps_get_fm_c(Port_handle, En_sig, Timing_control, Empty_reg, Data $gps_push_to_c(Port_handle, Data_sig)

$gps_pull_fm_c(Port_handle, Data_reg, Delay_spec, Delay_reg)

Port_handle—String name of the corresponding port in the C model.

Preceed Port_handle string with "F:" to force port to be in Verilog mode.

En_sig—Verilog signal indicating that operation is enabled, or "1" to always enable Timing_control—Callback action event control of the form "@(edge_event_expression)"

Empty_reg—Verilog register to store the node empty flag, or "0" for never empty

Full_reg—Verilog register to store the node full flag, or "0" for never full

Data_reg—Verilog register variable in which to write data read from C

Data_sig—Verilog signal containing data to be written to C

Delay_spec—Optional delay time when processing Verilog signal change, default is 0

Delay_reg—Optional Verilog signal in which to write delayed version of pull signal Status_reg—Optional Verilog register variable to store action completion status.

A bi-directional port is modeled by using both the $gps_get_fm_c( ) calls and $gps_put_to_c( ) calls with the same Port_handle. This works because all port connections to the C model node are really bidirectional. A read from a port obtains the oldest value from the FIFO of the connected node, and a write adds a new youngest entry to the FIFO of the node. By using the signals from both system calls, in combination with a tri-state assign statement in the CVI module, a wide variety of bi-directional signal protocols can be modeled. An example of a system with bi-directional signals is provided below in detail with reference to FIG. 4.

The $gps_push_to_c( ) system function is used to model asynchronous signals. Whenever Data_sig changes, the new value is written in "Write Over" mode to the node associated with Port_handle. The $gps_pull_fm_c( ) system function is also used to model asynchronous signals. Whenever a new value is written to the node associated with Port_handle, the Data_reg value is updated.

A delay feature is used to control the timing of power-on reset nodes. If Delay_spec is defined, then a second reader is defined, and this read occurs after the specified delay. If Delay_reg is specified, then it is set to the value read using the Delay_spec in a TransportDelay mode. In any of the CVI system task calls, an "F:" can be included at the beginning of the Port_handle string to force a specified port to be active, even if the port is only connected to other CVI ports. This call has the effect of setting the port's associated node to be in CVI mode.

When building a CVI module of the Verilog model, inclusion of system task calls in procedural blocks is not necessary. Preferably, all actions to be taken during the simulation are setup as callbacks by the CVI system tasks in the initial block. One of the main reasons for designing a CVI module in this way is to provide compatibility with cycle-based simulation. However, procedural blocks can be used in CVI modules if needed, provided they are cycle based simulation compatible. Generally, this means that they must follow the synthesis subset, and they cannot call any system tasks, or rely on Verilog #delay values.

Figure 3:
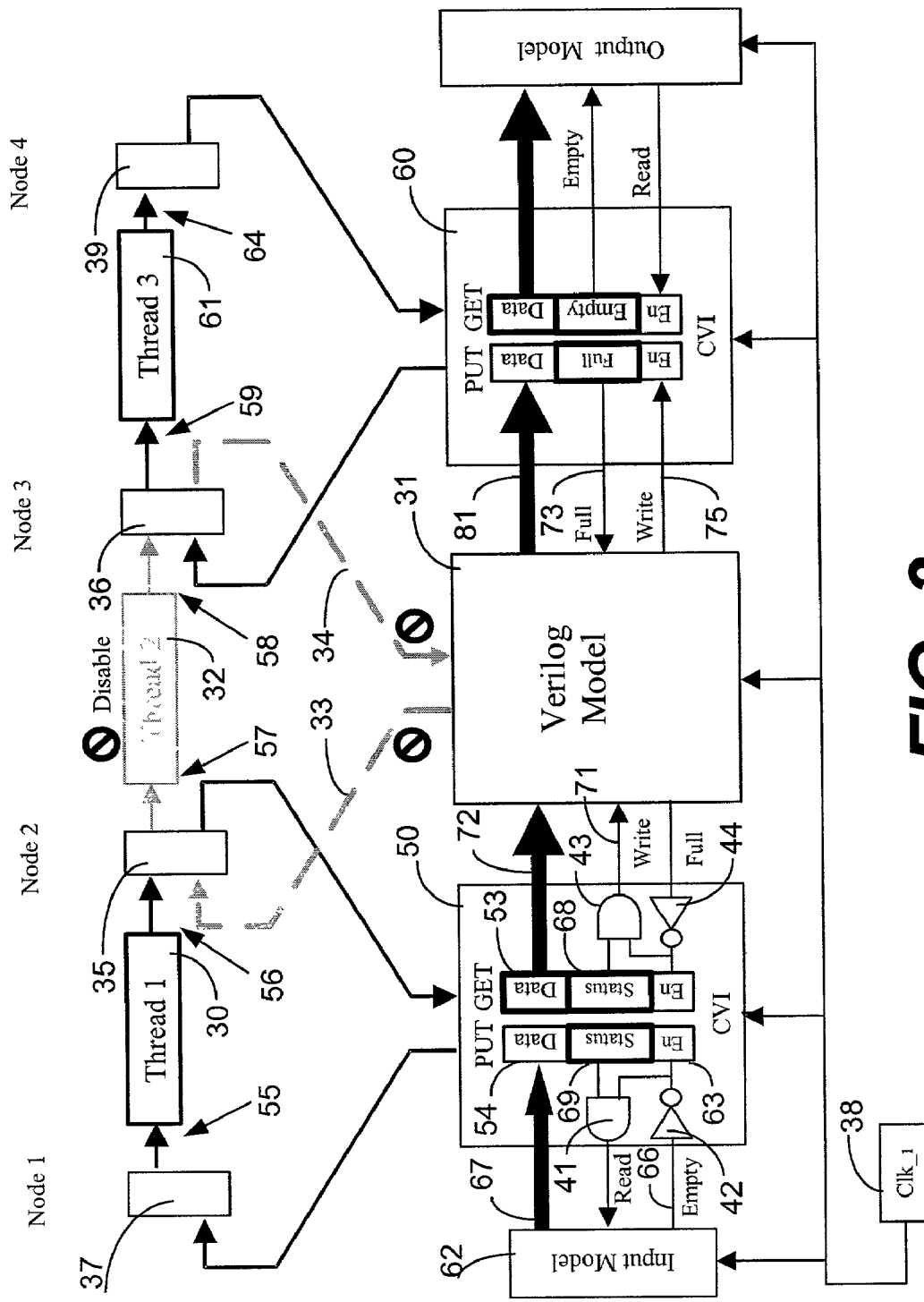
FIG. 3 illustrates a unidirectional data flow example to non-redundantly specify the configurations of the models in which the concepts and implementation details represented by the block diagram of FIG. 1 are utilized with mixed-language models.

In order to illustrate how the CVI modules may be used in accordance with the present invention, a unidirectional example will now be provided with reference to FIG. 3 in order to provide an understanding of the flow of data between the CVI modules and the Verilog and C model portions. The example shown in FIG. 3 demonstrates several different types of unidirectional FIFO interfaces. Since the model 31 corresponding to thread 2 is a Verilog model, thread 2 and its associated connections 33 and 34 to node 2 and node 3 labeled with numerals 35 and 36, respectively, are shown with dashed lines to indicate that they are disabled. The trigger event in this system is @(posedge Clk_i), or in other words, the positive edge of clock signal Clk_i, which is labeled with numeral 38. By using Verilog modeling code in the CVI module to connect external control signals to the GET and PUT system tasks, a wide variety of inter-module signaling protocols can be supported.

The Verilog code for the CVI module 50 in this example could look as follows:

```
Module block1 (Clk_i, Dout, Din, Empty, Read, Write, Full);
input Clk_i, Empty, Full;
output Write, Read;
input [3:0] Din;
output [3:0] Dout;
reg [7:0] data_reg;
reg valid_reg, st_reg;
wire NotEmpty = ~Empty;
wire Notfull = ~Full;
assign Dout = {data_reg[7],data_reg[5:4],data_reg[0]};
assign Write = (valid_reg & ! Full);
assign Read = (st_reg & ! Empty);
wire [5:0] put_din = {Din[3],1'b0,Din[2:1],3'b0,Din[0]};
initial begin
        $gps_put_to_c("Din", NotEmpty, "@(posedge Clk_i)", 0,
        put_din, st_reg);
        $gps_get_fm_c("Dout", NotFull, "@(posedge Clk_i)", 0,
        data_reg, valid_reg);
end
endmodule
```

The assign statement expressions in the Verilog code for the CVI modules correspond to the "AND" and "INV" gates 41, 42, 43, and 44.

The use of a concatenation in the above assign statement should be noted. This associates the bits of the output port Dout of the CVI module 50, which corresponds to arrow 72, to specific bits of data_reg 53. This is also where the CVI module author associates the bits written into data_reg 53 to the actual Verilog signals to which they correspond. Similarly, the data_sig argument 54 of the PUT system task (put_din) uses a concatenation to encode the incoming Verilog signals 67 into specific bits. The bit order in data_reg 53 and of data_sig 54 does not need to change with machine architecture because of the use of the aforementioned encode and decode functions.

The arrows 55, 56, 57, 58, 59, and 64 shown in FIG. 3 connecting to nodes 37, 35, 36, and 39 represent calls to read or write a port that is connected to the corresponding node. As in FIG. 1, in this example, the variables represented by blocks shown in bold in the CVI modules correspond to Verilog registers. The C model portions of the mixed-language model to be simulated are represented by the nodes 37, 35, 36, and 39 and by threads 30, 32, and 61. In the case of a stand-alone C model simulation, the CVI modules 50 and 60 and the Verilog model 31 would not be needed. However, for mixed-language simulation, CVI modules are instantiated for the portions of the mixed-language model that are to be simulated in C, and Verilog model portions are instantiated for the blocks that are to be simulated in Verilog.

As discussed above with reference to FIG. 2, during initialization, the GET and PUT tasks of the CVI modules 50 and 60 set flags on the nodes and the ports of the corresponding threads that the simulator uses during initialization to determine which connections need to be activated. The Verilog model 31 does not have any GET or PUT task calls, so the CVI_mode flags corresponding to ports associated with the second thread 32 are not modified from their initial value. This results in disablement of the second thread 32, and the lines 33 and 34 associated with the Verilog model 31 are dashed to indicate this. The C model has readers and writers that can be registered for the GET and PUT tasks that are in the CVI modules. If those readers and writers are not registered, the C model is able to determine that there is no data flowing from the Verilog model 31 into the second node 35 or out of the third node 36 associated with the second thread 32. Therefore, the simulator is able to determine that the second thread 32 does not ever need to be invoked as an executing thread.

Therefore, instead of the second thread 32 reading data out of the second node 35, the trigger action clock signal 38 causes the GET action of CVI module 50 to be activated, which causes the data to be read out of the second node 35 and stored in register 53 as a Verilog data signal. Each time the clock signal 38 occurs, the input model Verilog block 62 drives an empty signal 66 out and a data signal 67 out in the Verilog portion of the simulation. As the clock signal occurs, the enable signal 63 of the PUT call is set so that the PUT call knows that it is supposed to sample data on some particular clock edge when the input model 62 determined there was data. Thus, when the empty signal 66 goes low, the enable signal 63 goes high, thereby causing the PUT call to sample the data signal 67 coming in from the input model 62 into the CVI module 50 when the value in the status register 69 of the PUT call is high. This causes the PUT call to write the data signal 54 via an encode function into the first node 37.

Then, in the evaluation phase, a deferred action handler will schedule the first thread 30 to have some time to execute and then thread 30 will read out of the first node 37 the data that got written to it by the PUT call. The thread 30 will then process this data and write the results of this processing into the second node 35. Meanwhile, the GET call of CVI module 50 was triggered on the same clock edge that triggered the PUT call. Therefore, the GET call will continue attempting to read data out of the second node 35 until data is present in the second node 35, or until an iteration limit condition occurs indicating that the C model is stable. The data read out of node 35 is written into the data register 53 associated with the GET call, and then is driven out of the CVI module 50 as a Verilog signal 72 on the next clock signal.

The value of the status register 68 of CVI module 50 becomes "true" if the GET call successfully obtained data from the second node 35, which causes the write signal 71 to go high. On the next clock cycle, the Verilog model 31 will sample the write signal 71 and determine that it is high, and will therefore sample the data 72 from the data register 53 coming into the Verilog model 31. The Verilog model 31 will process the new data and, some number of clock cycles later, will set its write signal 75. Verilog model 31 will maintain the data value as long as the full signal 73 of CVI module 60 is high. Then, on some later clock cycle, the CVI module 60 will set the full signal 73 low. This occurs as the third thread 61 reads data from the node 36, thus freeing up a slot in which to write data into the third node 36. On a cycle when the node full flag has been set low (signal 73), and the write enable input signal 75 is high, the PUT task in CVI module 60 will sample the data 81 coming out of the Verilog model 31. The CVI module 60 PUT task will then write the data to the third node 36 of the third thread 61 and the process will continue in the manner described above with reference to the CVI module 50.

Figure 4:
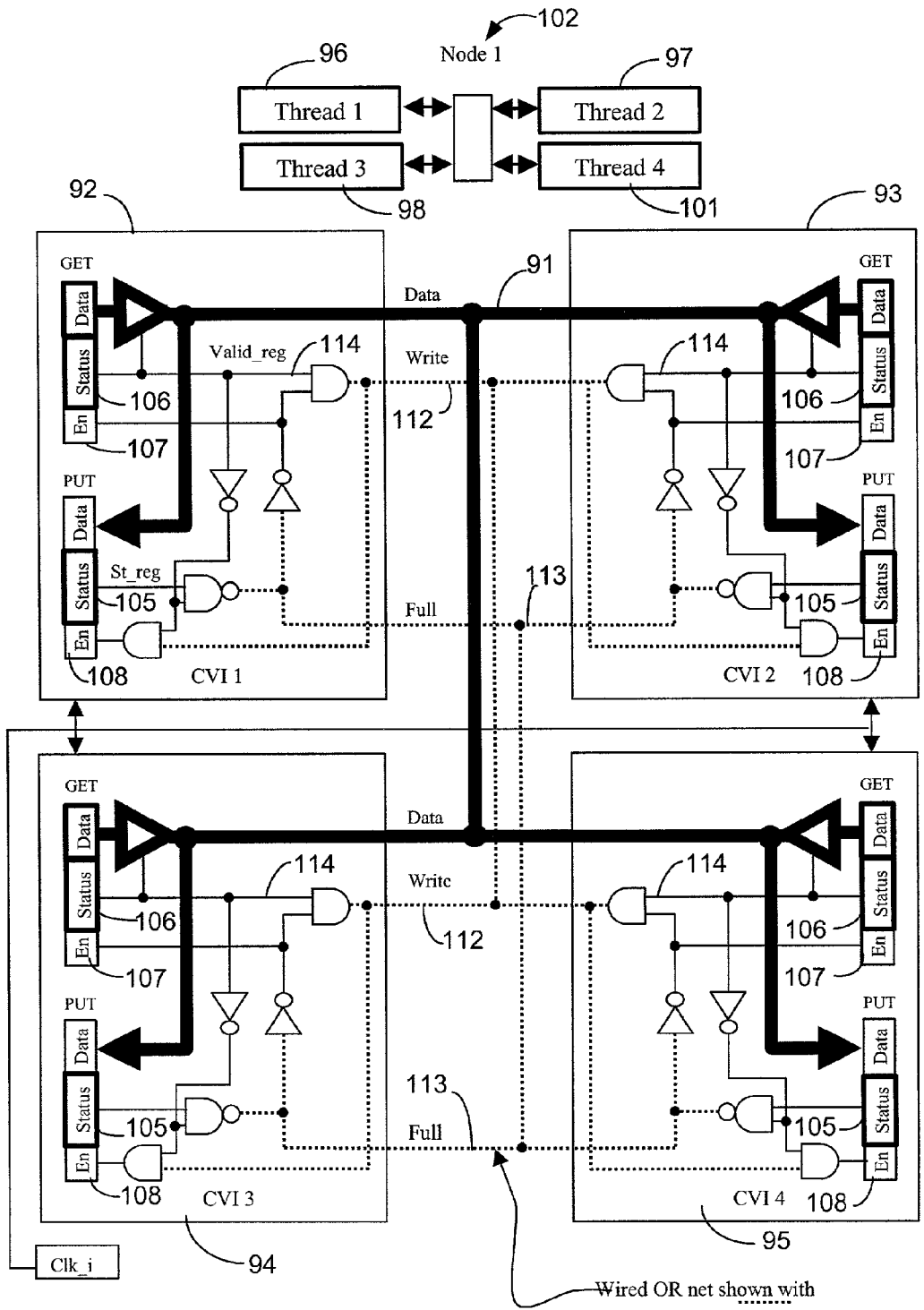
FIG. 4 illustrates a bi-directional data flow example to non-redundantly specify the configurations of the models in which the concepts and implementation details represented by the block diagram of FIG. 1 are utilized with mixed-language models.

The example shown in FIG. 4 illustrates the manner in which the CVI system tasks are used to model a multipoint, bidirectional bus 91. The bus protocol is assumed to include, in the data bits of the bus 91, information that determines which of the CVI modules 92, 93, 94, or 95 will be allowed to write on the next cycle. For simplicity, no Verilog model portions are shown in FIG. 4, although they are presumed to exist. Also, all of the CVI modules that are not writing data are assumed to be reading data, and determining whether the data is to be used by them. The focus of this example is to illustrate how multiple readers and writers of a node are managed, rather than a specific bus protocol or addressing mechanism.

Each of the CVI modules 92–95 has a corresponding thread associated with it. The first, second, third and fourth threads are labeled with the numerals 96, 97, 98, and 101, respectively. Node 102 represents the data on the bus 91. Each of the threads has a bidirectional arrow connecting its port to the node 102. This is meant to indicate that each thread can read and write the ports associated with the node 102. Whenever a thread writes to a bidirectional node, the following procedures are preferably followed:

Read and process all current data in the pipe. This ensures that the internal state of the thread is "caught up" with the current time, before doing a write.

Write data to the node, and immediately read back the data that was just written to ensure that the read pointer does not get behind and cause a hang. This occurs because the writing thread is also listed as a reader of the node.

The source and destination thread ID stored with the data in the CVI mode node, and the CVI subnode structure are particularly important for the bidirectional case represented by FIG. 4. It should be noted that multiple CVI modules with the same trigger event might be connected to the same node. This means that each of the CVI modules with the valid signal high will sample the data and write it to the node 102. Therefore, multiple copies of the same data for the same trigger event appear in the V2C subnodes of the node 102. Without the association of threads 96, 97, 98, and 101 to specific V2C subnodes, the C models would process that same data multiple times, and get out of sequence.

Data written by a thread is addressed to only the corresponding CVI module, and data written by a CVI module is addressed to only its corresponding thread. Also, in cycles in which the C model is stable, but no data was written by the corresponding threads of the CVI modules, the corresponding status registers 106 associated with the GET calls of the CVI modules to be set low. The status registers 106 can therefore be used as tri-state enable signals in the CVI modules. The instance with the status register 106 set high causes the bus 91 to be driven for that clock cycle, and the other CVI modules (i.e., those with the status registers set low) will have their output drive enable signals 114 set low. The Verilog code for the CVI modules of the bi-directional block in this example might look as follows:

```
Module io_block (Clk_i, Data, Write, Full);
input Clk_i;
Data [7:0] Data;
inout Write, Full;
req [7:0] data_reg;
req valid_reg, st_reg, empty_reg, full_reg;
wire (strong1, pull0) Write, Full;
assign Data = valid_reg ? data_reg : 8'bz;
assign Write = (valid_reg & ! Full);
wire NotFull = (st_reg & ! valid_reg);
wire data_put_en = (!valid_reg & Write);
initial begin
    $gps_put_to_c("Data", data_put_en, "@(posedge Clk_i)",
        full_reg, Data, st_reg);
    $gps_get_fm_c("Data", NotFull, "@(posedge Clk_i)", empty_reg,
        data_reg, valid_reg);
end
endmodule
```

The nets shown as dotted lines represent a wired OR operation. Any CVI module that drives high the Write net 112 or the Full net 113, results in the net value being high. The net value is low only if none of the CVI modules are driving high. This can be accomplished in Verilog by using a wire for the Full and Write ports that drives strong 1 and resistive 0. In this case, the Full and Write ports must also be declared as I/O ports. The meaning of the Write signal 102 is that there is valid data on the bus 91 that should be written. If none of the CVI modules have valid data, then the bus 91 goes to high-Z and the Write signal will be low. The Full signal 113 goes high when any CVI module, other than the current writer, becomes full. This signal also forces the Write signal 112 low, and informs the writing CVI module that the next data written will not be received. The writing CVI module therefore knows not to attempt to write a new value on the next cycle.

CVI Event Processing Algorithm

Figure 5:
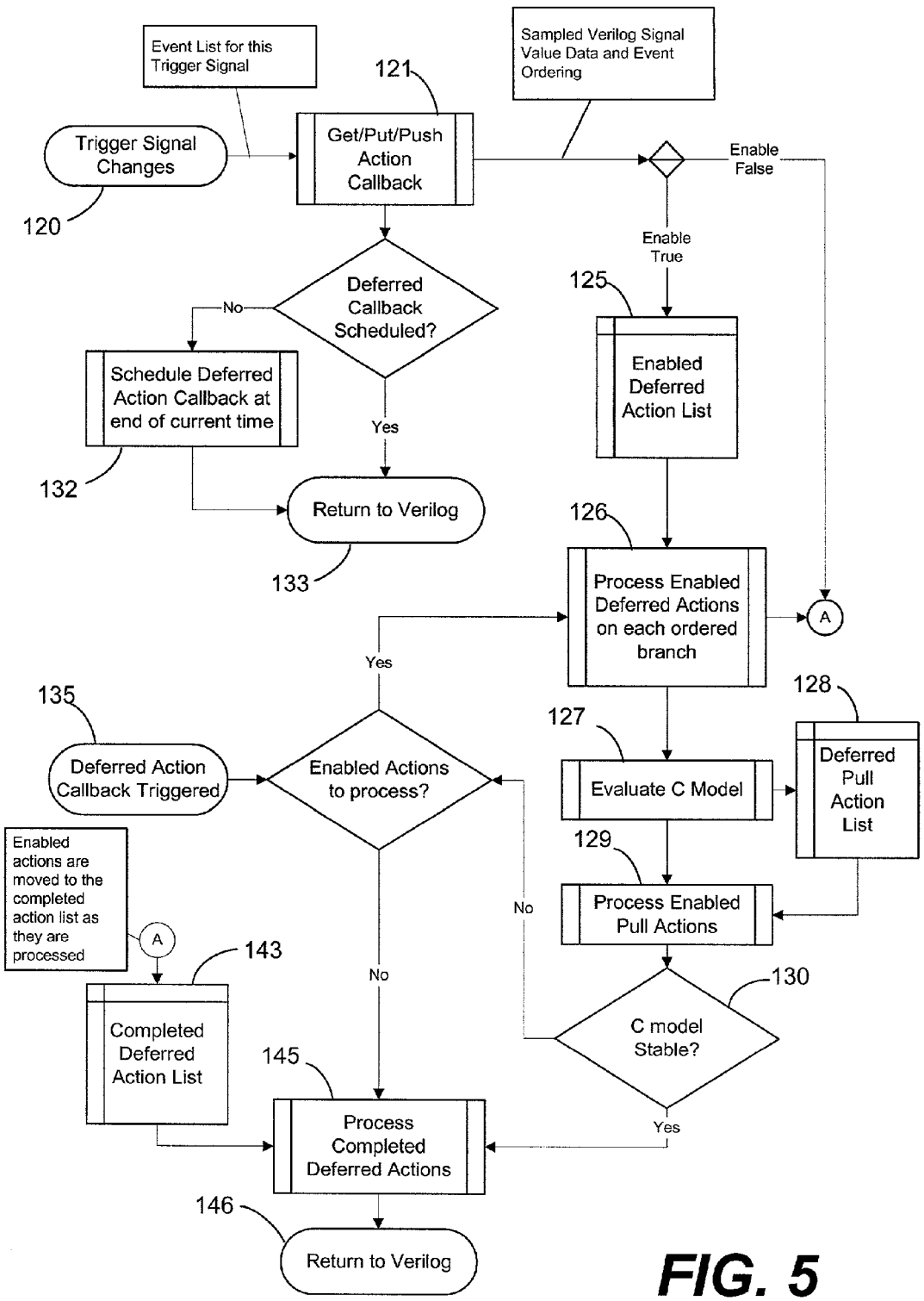
FIG. 5 is a flow chart illustrating the event processing algorithm of the present invention in accordance with one embodiment, which is performed during simulation after the configurations of the models have been specified.

The event processing algorithm of the present invention in accordance with the preferred embodiment will now be described with reference to FIGS. 5–8. FIG. 5 is a flow chart illustrating the CVI event processing algorithm of the present invention in accordance with the preferred embodiment. When a trigger event (block 120) that is listed in GET, PUT, or PUSH calls occurs, an "Action Callback" function (block 121) is called, which obtains a list of edge events that are to be processed for that trigger event (block 120). The list of edge events obtained by the "Action Callback" function (block 121) is specific to a particular CVI instance, and is structured in the manner shown in FIG. 6 and discussed below in detail. The "Action Callback" function (block 121) checks the value of the trigger signal as retrieved from the HDL simulator, and compares it with the value expected for each event type (block 158 of FIG. 6).

If the data value of the trigger signal matches the value of the edge type expected for that event, the "Action Callback" function (block 121) checks the enable signal and the current full or empty register value specified in the system function calls. This step of checking the enable signal and the current full or empty register value specified in the system function calls is represented by decision block 122. If the enable signal is HIGH, and the previous event full or empty register is low, then the action is considered enabled and is added to the "enabled deferred action list" for the trigger event that occurred, as indicated by block 125. If the enable signal is LOW, or the previous event full or empty register is high, then the action is NOT enabled, and it is added to the "completed deferred action list" 143, as indicated by the arrow from decision block 122 to circle 123 on the right-hand side of the figure and by the arrow from the connection circle 123 on the left-hand side of the document to the completed deferred action list 143. The circles 123 having the letter "A" within them correspond to the same node in the flow chart of FIG. 5.

For enabled PUT or PUSH actions, the current data signal value is sampled and stored, as indicated by block 124. It is important that data sampling be done immediately when the trigger signals occur, because other models may have changed the value of the signal by the time the deferred action handler is called, and simulation results would then be invalid. The order of the events in the enabled deferred action list (block 125) is maintained so that the evaluation order matches the order in which the events are coded in the CVI module. The enabled deferred action list (block 125) contains all the deferred actions for all CVI modules that have occurred at a given simulation time. In essence, each CVI instance is listed, and each listed CVI instance, in turn, comprises a list of associated deferred actions that are to be processed.

After the aforementioned action processing function (block 121) places an action on the deferred action list (block 124 and 143), it then determines whether or not the deferred action callback handler has been scheduled (decision block 131). If the deferred action callback handler has not been scheduled, the deferred action callback handler is scheduled to occur at the end of the events within the current time, as indicated by block 132. Execution then returns to the Verilog simulator code, as indicated by block 133. The deferred action callback handler performs a "deferred action callback" function, which is represented by the entry point 135 and by blocks 126, 129, and 145. The deferred action callback function is executed at the end of processing events for the current time, but before closing the current times' ability to write new data values. In the VPI, this callback reason is called "cbReadWriteSync". The deferred action handler iterates until all of the enabled actions have been completed, the C model is stable, or the iteration limit is exceeded. These iterations are represented by the blocks 126, 127, 128, 129, 130 and 134. The functions performed by these blocks can be characterized as follows:

For each CVI instance and each trigger event with enabled deferred actions, process actions (126) at the top of each execution branch on the enabled deferred action list (125) until an action cannot be completed, then go to the next execution branch; when all execution branches for a given trigger event have been tried, go on to the next trigger event; when all trigger events in an instance have been processed, go on to the next instance; as each action is completed, a success flag is set (Action Completion Status of Object 159 in FIG. 6), and the action is moved to the completed deferred action list (143); at the end of the list of CVI instances, suspend execution of the Verilog thread (which also executes the C-to-Verilog Interface functions) and allow the C model threads to run (127); after the C models have run, process any PULL actions (129) that were scheduled due to the C model writing new values into a "Deferred Pull action list" (128); check for C model stability (130) and then start the next iteration if it is determined (134) that there are more enabled deferred actions to be processed.

In accordance with this example embodiment, the C model is deemed to be stable if no threads have read or written data to any port after two cycles through all of the threads have occurred. If the iteration limit is exceeded before the enabled deferred action list is empty, preferably the remaining actions are aborted, register values are set to unknown, and a warning is issued (not shown). If the C model became stable, then remaining PUT and PUSH actions are handled in the same manner as when the iteration limit has been exceeded. However, GET actions for which the C model supplied no new data are not considered to be an error, but are considered complete with a status of false. This is because there may simply be no more data available at the time. The CVI module will use the status flag in this case to generate an HDL language signal to indicate whether the data is valid.

After the iteration loop (blocks 126, 127, 128, 129, 130, 134) exits, the status, empty, and full registers for actions on the completed deferred action list are set during a process represented by block 145. The status register is set using the completion status flag, and the empty or full registers are set by checking the final state of the associated node. Execution then returns to Verilog, as indicated by block 146.

Figure 6:
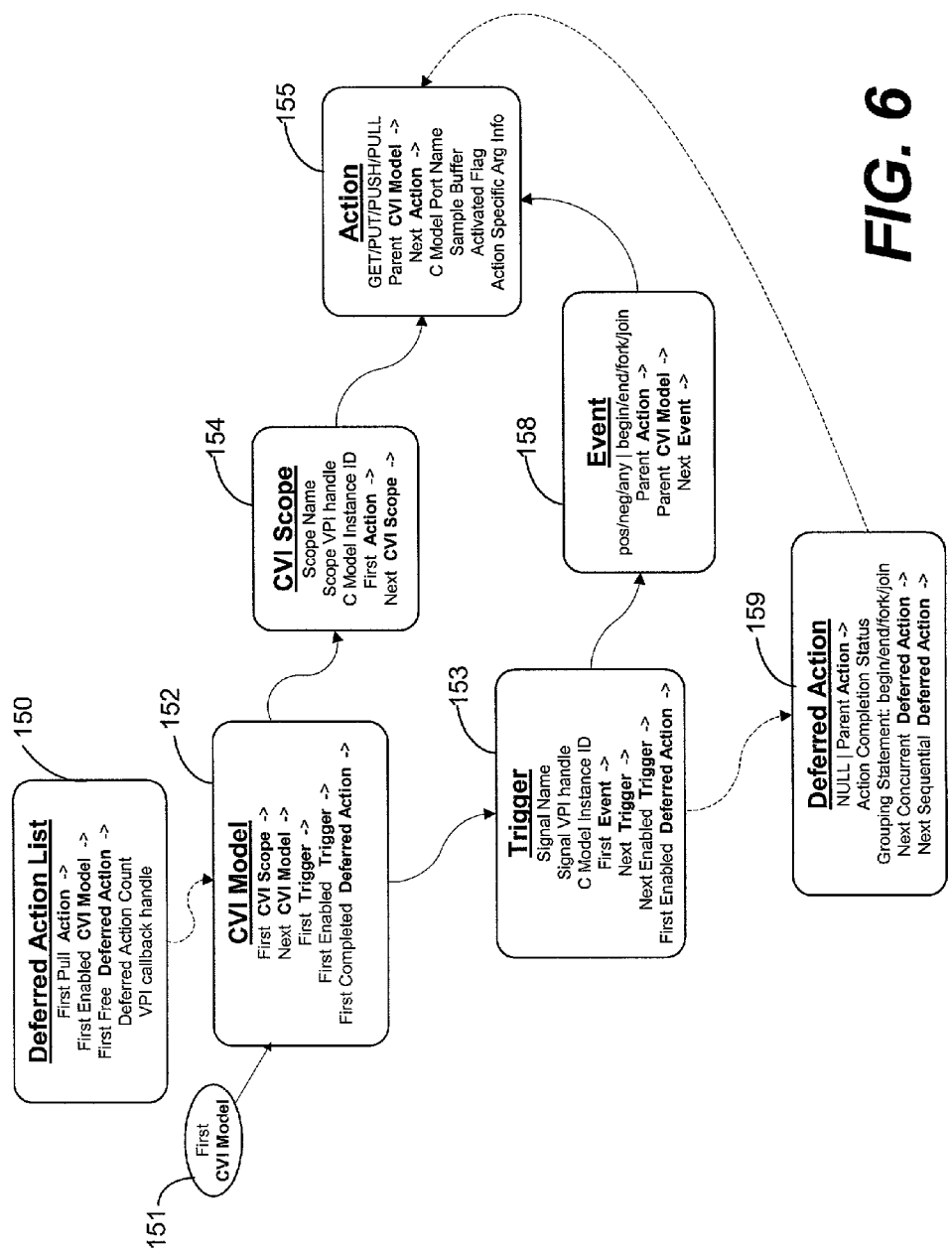
FIG. 6 is a diagram illustrating a data structure of the interfaced mixed-language model objects that enables the event processing algorithm shown in FIG. 5 to be performed.

In FIG. 6, each of the objects in the CVI module data structure, in accordance with the preferred embodiment, are shown. Entries that are pointers to other objects are shown with the referenced object type in Bold followed by '->'. Fields shown with values separated by '/' are enumerations of specific choices which specify the record type. For example the "Event" object 158 can be a 'pos0', 'neg', or 'any' edge event, or a 'begin', 'end', 'fork' or 'join' blocking statement. Fields containing the '|' character, as in the "Event" object 158, indicate that the object operates in distinct modes which may affect how other fields are used. The objects' primary relationships are shown with arrows 156. The object relations shown with solid-line arrows 156 indicate that the CVI module data structure relation is built once during the initialization phase of simulation (blocks 23 and 24 of FIG. 2). The building of the objects and relations represented by these blocks (152, 153, 154, 155, 158) corresponds to the static portions of the CVI module data structure objects. The object relationships shown with dashed-line arrows 156 indicate object relationships (blocks 150 to 152, 153 to 159 and 155) that are dynamically changing as the simulation runs.

The static portion of the CVI module data structure is built up as the simulator is processing the initial blocks in the Verilog CVI modules (block 23 in FIG. 2). As the CVI system tasks are called, the corresponding task finds the Verilog model and scope from which it was called, and inserts an Action object 155 that saves the argument information from the task. The Action object 155 includes an Action list that includes the port name and associated node pointer enable, status, and data argument handles, as well as the action type. The Trigger object 153 includes a Trigger list that holds names and handles for trigger signals appearing in the GET, PUT or PUSH calls of the instance, as well as a list of edge and block statement type Event objects 158 associated with the trigger signals. For the PUSH action, the trigger event is a value change of the signal itself. Each Event object 158 has a pointer to a GET or PUT action object 155 that should be processed when the event occurs. The Action list and the Trigger List are static during the simulation, but the enabled deferred action Trigger list and the completed deferred action list contained in the Deferred Action List object 150 change as events are scheduled and processed during the simulation.

In order to improve performance, in accordance with the preferred embodiment of the present invention, the trigger event argument of the task is separated out into the Trigger object 153 and the Event object 158. This separation allows task calls within the same model that have the same trigger signal to share the same Trigger object, and thus only one callback is needed for each trigger signal in the model. The entry point for the static model database is a global variable, represented by block 151, references the first CVI Module object 152 on the list. The Deferred Action List object 150 is the entry point for the dynamically changing portion of the action database. As trigger events occur, Deferred Action objects 159 are moved from a free list (referenced from the "First Free Deferred Action" field of object 150), and are placed on either the enabled or completed deferred action lists contained in the Deferred Action List object 150. The type field in the Event object 158 can be set to a begin/end/fork/join blocking statement. These types correspond to Verilog grouping statements. These grouping Event objects act as templates to define the sequence order for the processing of events on the Deferred Action List object 150. The grouping Event object 158 results in a corresponding grouping statement in the Deferred Action object 159 when the event list for Trigger object 153 is processed.

The deferred action list entries are added to the Deferred Action List object 150 as action events occur, and are removed as they are completed by iterations of the C model, as described above with reference to FIG. 5. An instance in the CVI Module object 152 may contain multiple CVI scope objects 154. The first scope always corresponds to the CVI module. Other scopes are created when named Verilog begin-end or fork-join blocks are defined. It is the scope path from which a CVI task is called that is matched against the C model instance path during the intialization phase described in FIG. 2. Verilog named begin-end blocks can therefore be used to define additional hierarchy levels in order to create a correspondence with the C model.

Dual Clock CVI Module Example

The code module shown below is a contrived example of a CVI module with multiple trigger signals and two independent data paths. The purpose of this example

```
Module dual_clk_block (ClkA_i, ClkB_i, DataA_i, DataB_i,
    DataA_o, DataB_o, En_A, En_B, Valid_A, Valid_B);
input ClkA_i, ClkB_i;
input [7:0] DataA_i, DataB_i;
output [7:0] DataA_o, DataB_o;
output Valid_A, Valid_B;
reg [7:0] DataA_o, DataB_o;
reg st_A, st_B, Valid_A, Valid_B;
initial begin
    $gps_put_to_c("DataA_i", En_A, "@(posedge ClkA_i)",
        0, DataA_i, st_A);
    $gps_get_fm_c("DataA_o", 1,
        "@(posedge ClkA_i or negedge ClkB_i)",
        0, DataA_o, Valid_A);
    $gps_put_to_c("DataB_i", En_B, "@(posedge ClkB_i)",
        0, DataB_i, st_B);
    $gps_get_fm_c("DataB_o", 1, "@(ClkB_i)",
        0, DataB_o, Valid_B);
end
endmodule
``` is to illustrate how the action database is built up to handle arbitrary combinations of clocks, and to control the sequencing of events in the simulator, not to show recommended coding style. The example will be described with reference to the action database diagram shown in FIG. 7.

Figure 7:
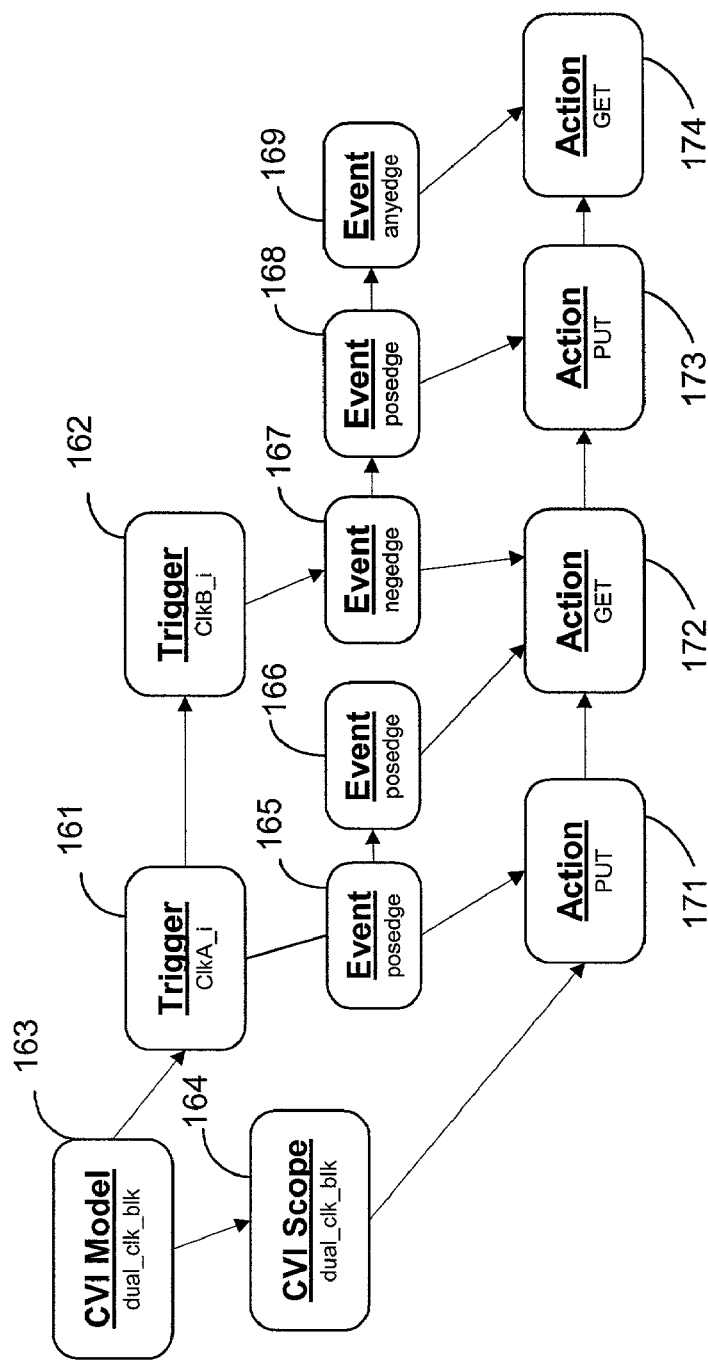
FIG. 7 is a diagram illustrating an example the action database of the present invention in accordance with one embodiment.

The example Verilog module above is represented in FIG. 7 starting with CVI Module object 163, and the CVI Scope object 164, which in this case corresponds to the scope for the entire module. The GET and PUT calls for the above module get translated into the Action objects 171, 172, 173 and 174 shown in FIG. 7. The trigger signals referenced in these calls are represented in FIG. 7 as the Trigger objects 161 and 162. The edge specification qualifiers on the GET and PUT call trigger expressions are represented as the Event objects 165, 166, 167, 168, and 169. The order of events in the list is derived from the order in which the GET and PUT calls appear in the CVI module. It should be noted that the list contains a trigger object (blocks 161 and 162) for each unique trigger signal (ClkA_I and ClkB_I) that is used in the module. Also, it should be noted that the same action can be activated by more than one event, and possibly from different trigger signals, as is the case shown for Action object 172, which is referrenced from Event objects 166 and 167.

Figure 8:
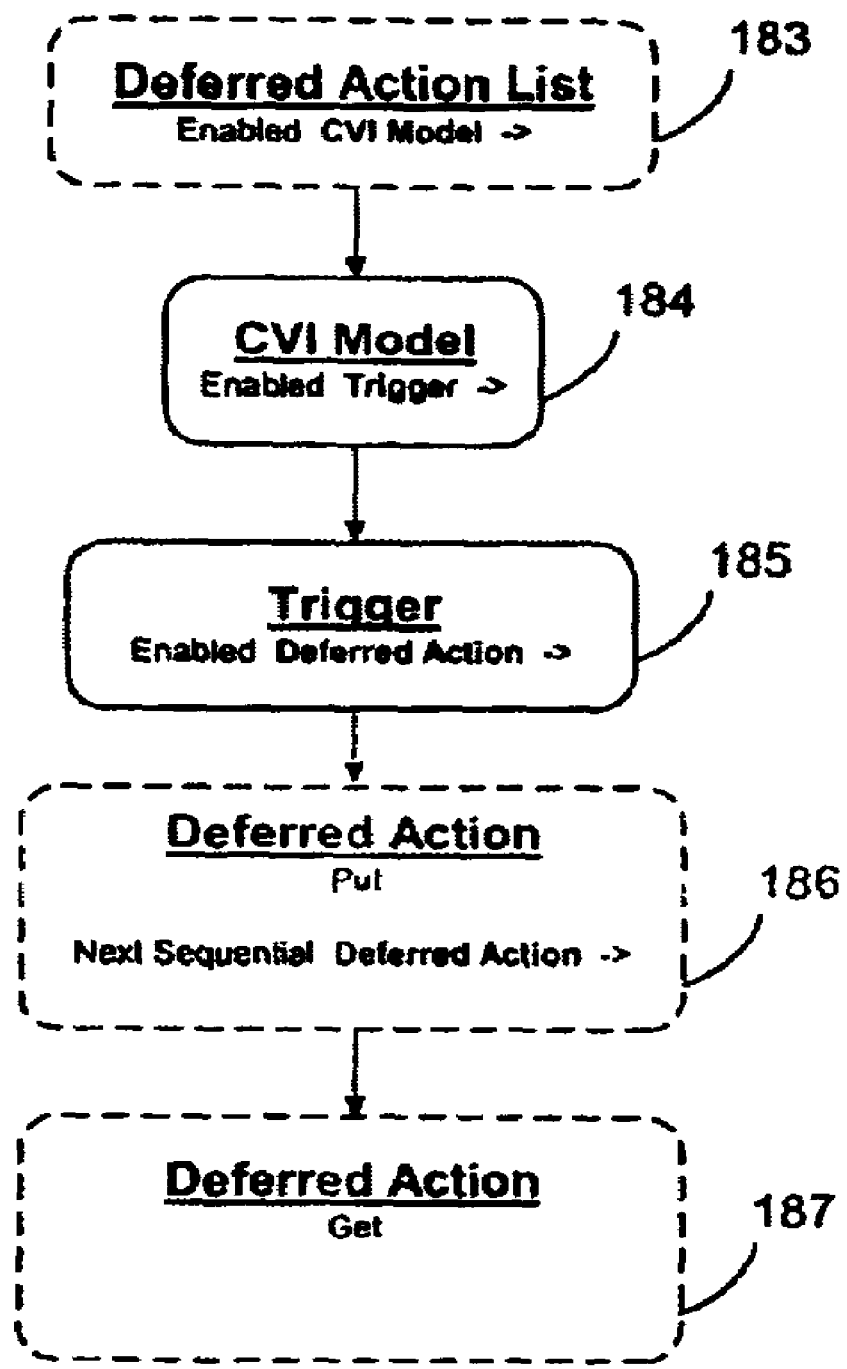
FIG. 8 is a diagram illustrating an example of a deferred action list generated from the action database example shown in FIG. 7 when a trigger event occurs.

For the example action database shown in FIG. 7, when a positive edge of trigger signal ClkA_i occurs, for example, then the Deferred Action list entries shown in FIG. 8 will be generated. The Deferred Action List object 183 represents the global list containing all deferred actions needing to be processed at the current time. The CVI Model object 184 and Trigger object 185 corresponds to the CVI Model object 163 and Trigger object 161 in FIG. 7. The Event object 165 results in the generation of Deferred Action object 186, and Event object 166 results in the generation of Deferred Action object 187. When the Deferrered Action Handler procedure (FIG. 5, block 126) is called, it will process Deferred Action object 186 first, and Deferred Action object 187 next. As the actions are completed, they are moved to the completed action list of the CVI Model object 184. This list is stored on the "First Completed Deferred Action" field shown in the CVI Module object 152 in FIG. 6.

Therefore, it can be seen from the embodiments described above that the present invention minimizes the number of context switches required in order to process trigger events. By deferring actions to be processed for trigger events, rather than processing them directly and immediately as trigger events occur, actions are processed efficiently in the HDL model domain and in the source model domain, thereby minimizing the number of context switches between the HDL model domain and the source code model domain and reducing processing overhead. Consequently, the mixed-language simulation is optimized.

It should be noted that the present invention has been described with respect to one particular implementation, which corresponds to the preferred embodiment of the present invention. However, as will be understood by those skilled in the art that, in view of the description provided herein, the present invention can be implemented in a number of ways to achieve the goals of the present invention, i.e., utilizing mixed-language models in a simulator to test and model hardware designs. Therefore, those skilled in the art will understand that modifications can be made to the implementation discussed above, and that all such modifications are within the scope of the present invention.

What is claimed is:

1. An apparatus for performing event processing in a mixed-language simulator, the mixed-language simulator utilizing at least one model written in a source code language and at least one model written in a hardware description language (HDL), said at least one source code model and said at least one HDL model being interfaced by source-code-to-HDL-interface code, the apparatus comprising:

logic for generating a list of actions to be performed for a given trigger event occurrence and for attempting to process at least some of the listed actions in a source-code-to-HDL-interface domain before performing, for the trigger event occurrence, a context switch from the source-code-to-HDL-interface domain to a source code model domain, the HDL model domain corresponding to execution of said at least one model written in the HDL, the source code model domain corresponding to execution of said at least one model written in the source code language, and the source-code-to-HDL-interface domain corresponding to execution of the source-code-to-HDL-interface code, and wherein by generating said list of actions and attempting to perform at least some of the actions before the context switch is performed, an amount of context switching between the HDL model domain and the source code and interface domains performed during simulation is reduced.

2. The apparatus of claim 1, wherein said logic comprises detection logic for detecting when a trigger event has occurred and for obtaining a trigger signal value when the occurrence of a trigger event has been detected, the trigger signal value obtained being used by said detection logic to generate said list of actions.

3. The apparatus of claim 1, wherein said list of actions includes an enabled deferred action list and a completed deferred action list, wherein said logic includes callback action logic that obtains a trigger signal value associated with the trigger event occurrence and compares the trigger signal value with a one or more edge type values to determine whether or not the trigger signal value matches any of said one or more edge type values, wherein if a determination is made that the trigger signal value matches said one or more edge type values, said callback action logic determines whether or not each action on said list of actions is enabled, and wherein said callback action logic places enabled actions on the enabled deferred action list and actions that are not enabled on the completed deferred action list, and wherein said logic attempts to perform each action listed on the enabled deferred action list before switching contexts from the source-code-to-HDL-interface domain to the source code model domain.

4. The apparatus of claim 1, wherein said logic includes stability determination logic that determines whether or not said at least one model written in the source code language has become stable after switching context from the source-code-to-HDL-interface domain to the source code model domain, wherein if said stability determination logic determines that said at least one model written in the source code language has become stable, said stability determination logic causes a context switch to occur from said source-code-to-HDL-interface domain back to said HDL model domain.

5. The apparatus of claim 1, wherein said logic comprises:
 a first logic, the first logic determining when a trigger event has occurred;
 a second logic, the second logic determining a type of trigger event that has occurred;
 a third logic, the third logic generating a list of actions to be performed based on the determination made by said second logic;
 a fourth logic, the fourth logic determining which of the actions in the list are enabled and which of the actions in the list are not enabled;
 a fifth logic, the fifth logic attempting to process each of the enabled actions; and
 a sixth logic, the sixth logic causing the context switch from source-code-to-HDL-interface domain to the source code model domain to occur once said fifth logic has attempted to process each of the enabled actions, wherein when the sixth logic causes the context switch from the source-code-to-HDL-interface domain to the source code domain to occur, said at least one model written in the source code language is executed.

6. The apparatus of claim 5, further comprising seventh logic, the seventh logic determining whether or not said at least one model written in the source code language has become stable, wherein if said seventh logic determines that said at least one model written in the source code language has become stable, the seventh logic causes a context switch from the source-code-to-HDL-interface domain back to the HDL model domain to occur.

7. The apparatus of claim 5, wherein, upon detecting the occurrence of a trigger event, said second logic determines whether or not a deferred action handler has been scheduled and, if not, schedules the deferred action handler for the end of a current time in which said trigger event occurred, and wherein at the end of the current time, said fifth logic uses said deferred action handler to attempt to process each of the enabled actions.

8. The apparatus of claim 7, further comprising seventh logic, wherein after the sixth logic makes the context switch from the source-code-to-HDL-interface domain to the source code model domain, the seventh logic determines whether or not said at least one model written in the source code language has become stable, wherein if said seventh logic determines that said at least one model written in the source code language has not become stable, the seventh logic causes a context switch from the source code model domain back to the source-code-to-HDL-interface domain to occur and determines whether any enabled actions need to be processed, and wherein if the seventh logic determines that any enabled actions need to be processed, the fifth logic uses said deferred action handler to attempt to process said any enabled actions.

9. The apparatus of claim 8, wherein, by waiting until the end of the current time to attempt to process enabled actions, context switching between said HDL model domain and said source code model domain is reduced.

10. A method for performing event processing in a mixed-language simulator, the mixed-language simulator utilizing at least one model written in a source code language and at least one model written in a hardware description language (HDL), said at least one model written in the source code language being interfaced with said at least one model written in the HDL by source-code-to-HDL-interface code, the method comprising:
 generating a list of actions to be performed for a given trigger event occurrence; and
 attempting to process at least some of the listed actions in a source-code-to-HDL-interface domain before performing, for the trigger event occurrence, a context switch from source-code-to-HDL-interface domain to a source code model domain, the HDL model domain corresponding to execution of said at least one model written in the HDL, the source code model domain corresponding to execution of said at least one model written in the source code language, and the source-code-to-HDL-interface domain corresponding to execution of the source-code-to-HDL-interface code.

11. The method of claim 10, wherein said step of generating said list of actions includes steps of detecting when a trigger event has occurred and of obtaining a trigger signal value when the occurrence of a trigger event has been detected, the trigger signal value obtained being used to generate said list of actions.

12. The method of claim 10, wherein said list of actions includes an enabled deferred action list and a completed deferred action list, wherein the step of generating said list of actions includes steps of obtaining a trigger signal value associated with the trigger event occurrence and of comparing the trigger signal value with a one or more edge type values to determine whether or not the trigger signal value matches any of said one or more edge type values, wherein if a determination is made that the trigger signal value matches said one or more edge type values, a determination is made during the step of generating the list as to whether or not each action on said list of actions is enabled and any actions determined to be enabled are placed on the enabled deferred action list and any actions determined not to be enabled are placed on the completed deferred action list, and wherein, during the processing step, attempts are made to perform each action listed on the enabled deferred action list before switching contexts from the source-code-to-HDL-interface domain to the source code model domain.

13. The method of claim 10, further comprising the step of making a stability determination to determine whether or not said at least one model written in the source code language has become stable after switching context from source-code-to-HDL-interface domain to the source code model domain, wherein if said stability determination results in a determination that said at least one model written in the source code language has become stable, a context switch from said source-code-to-HDL-interface domain back to said HDL model domain is performed.

14. A method for performing event processing in a mixed-language simulator, the mixed-language simulator utilizing at least one model written in a source code language and at least one model written in a hardware description language (HDL), the method comprising:
  determining when a trigger event has occurred;
  if a determination is made that a trigger event has occurred, determining a type of trigger event that has occurred;
  generating a list of actions to be performed based on the determination made as to the type of trigger event that has occurred;
  determining which of the actions in the list are enabled and which of the actions in the list are not enabled;
  attempting to process each of the enabled actions; and
  causing, in response to the trigger event, a context switch from an a source-code-to-HDL-interface domain to a source code model domain to occur once attempts have been made to process each of the enabled actions, wherein when the context switch from the source-code-to-HDL-interface domain to the source code domain occurs, said at least one model written in the source code language is executed.

15. The method of claim 14, further comprising a steps of:
  determining whether or not said at least one model written in the source code language has become stable; and
  wherein if determination is made that said at least one model written in the source code language has become stable, causing a context switch from the source code model domain back to the HDL model domain to occur.

16. The method of claim 14, wherein, upon determining that a trigger event has occurred, said method further comprises the steps of:
  determining whether or not a deferred action handler has been scheduled;
  if a determination is made that the deferred action handler has not been scheduled, scheduling the deferred action handler to be executed at an end of a current time in which said trigger event occurred; and
  at the end of the current time, in said step of attempting to process each of the enabled actions, using the deferred action handler to attempt to process each of the enabled actions.

17. The method of claim 16, further comprising the steps of:
  after the context switch from the source-code-to-HDL-interface domain to the source code model domain has been made, making a determination as to whether or not said at least one model written in the source code language has become stable;
  wherein if a determination is made that said at least one model written in the source code language has not become stable, causing a context switch from the source code model domain back to the source-code-to-HDL-interface domain to occur;
  determining whether or not any enabled actions need to be processed; and
  if a determination is made that said any enabled actions need to be processed, using said deferred action handler to attempt to process said any enabled actions.

18. The method of claim 16, wherein, by waiting until the end of the current time to attempt to process enabled actions, context switching between said HDL model domain and said source code model domain is reduced.

19. A computer program for performing event processing in a mixed-language simulator, the mixed-language simulator utilizing at least one model written in a source code language and at least one model written in a hardware description language (HDL), the computer program being embodied on a computer readable medium, the computer program comprising:
  a first code segment, the first code segment determining when a trigger event has occurred;
  a second code segment, the second code segment determining a type of trigger event that has occurred;
  a third code segment, the third code segment generating a list of actions to be performed based on the determination made as to the type of trigger event that has occurred;
  a fourth code segment, the fourth code segment determining which of the actions in the list are enabled and which of the actions in the list are not enabled;
  a fifth code segment, the fifth code segment attempting to process each of the enabled actions; and
  a sixth code segment, the sixth code segment causing, in response to the trigger event, a context switch from an HDL model domain to a source code model domain to occur once attempts have been made to process each of the enabled actions, wherein when the context switch from the HDL domain to the source code domain occurs, said at least one model written in the source code language is executed.

20. The computer program of claim 19, further comprising:
  a seventh code segment, the seventh code segment determining whether or not said at least one model written in the source code language has become stable;
  an eighth code segment, wherein if a determination is made by said seventh code segment that said at least one model written in the source code language has become stable, the eighth code segment causes signal state changes corresponding to completed actions in the list to occur in the HDL model domain prior to a context switch from the source-code-to-HDL-interface domain back to the HDL model domain;

an ninth code segment, wherein if a determination is made by said seventh code segment that said at least one model written in the source code language has become stable, the ninth code segment causes a context switch from the source code model domain back to the HDL model domain to occur;

a tenth code segment, the tenth code segment determining whether or not a deferred action handler has been scheduled;

an eleventh code segment, wherein if a determination is made by the tenth code segment that the deferred action handler has not been scheduled, the eleventh code segment schedules the deferred action handler to be executed at an end of a current time in which said trigger event occurred; and a twelfth code segment, wherein at the end of the current time, the twelfth code segment invokes the deferred action handler to attempt to process each of the enabled actions.

21. The system of claim 1, wherein at least one of the listed actions is processed in the source code model domain after the context switch.

22. The system of claim 1, wherein the source-code-to-HDL-interface code and the at least one model written in the HDL are executed via a first thread, and wherein the at least one model written in the source code language is executed via at least one additional thread.

23. The system of claim 22, wherein the source-code-to-HDL-interface code is written in the source code language.

24. The system of claim 22, wherein the context switch switches execution from the first thread to the at least one additional thread.

25. The system of claim 1, wherein the context switch switches execution from a first thread to at least one additional thread.

26. The method of claim 10, wherein the source-code-to-HDL-interface code and the at least one model written in the HDL are executed via a first thread, and wherein the at least one model written in the source code language is executed via at least one additional thread.

27. The method of claim 26, wherein the source-code-to-HDL-interface code is written in the source code language.

28. The method of claim 26, wherein the context switch switches execution from the first thread to the at least one additional thread.

29. The method of claim 10, wherein the context switch switches execution from a first thread to at least one additional thread.

30. The method of claim 14, wherein the context switch switches execution from a first thread to at least one additional thread.

31. The method of claim 19, wherein the context switch switches execution from a first thread to at least one additional thread.

* * * * *